United States Patent [19]

Rinderle

[11] Patent Number: 5,124,575

[45] Date of Patent: Jun. 23, 1992

[54] CIRCUIT ARRAY FOR SETTING THE OPERATING POINT OF A TRANSISTOR

[75] Inventor: Heinz Rinderle, Heilbronn, Fed. Rep. of Germany

[73] Assignee: Telefunken electronic GmbH, Heilbronn, Fed. Rep. of Germany

[21] Appl. No.: 324,427

[22] Filed: Mar. 16, 1989

[30] Foreign Application Priority Data

Apr. 11, 1988 [DE] Fed. Rep. of Germany ....... 3811950

[51] Int. Cl.[5] .................. H03K 3/01; H03F 3/04
[52] U.S. Cl. ........................ 307/296.6; 330/296; 323/315
[58] Field of Search ............... 307/296.6; 330/296, 330/288; 323/315

[56] References Cited

U.S. PATENT DOCUMENTS

| | | | |
|---|---|---|---|
| 3,886,435 | 5/1975 | Steckler | 307/296.6 |
| 3,891,935 | 6/1975 | Limberg | 330/22 |
| 3,943,380 | 3/1976 | Morgan et al. | 307/235 T |
| 3,980,963 | 9/1976 | Doi | 330/23 |
| 4,122,402 | 10/1978 | Main | 330/288 |
| 4,238,738 | 12/1980 | Komori | 330/256 |
| 4,575,685 | 3/1986 | Dobkin et al. | 330/296 |
| 4,742,309 | 5/1988 | Chu | 330/258 |
| 4,798,975 | 1/1989 | Walczak et al. | 307/529 |

FOREIGN PATENT DOCUMENTS

| | | |
|---|---|---|
| 2515457 | 8/1979 | Fed. Rep. of Germany . |
| 3106703 | 1/1982 | Fed. Rep. of Germany . |
| 3220736 | 4/1983 | Fed. Rep. of Germany . |
| 2828147 | 5/1984 | Fed. Rep. of Germany . |
| 3515006 | 10/1985 | Fed. Rep. of Germany . |
| 3744751 | 1/1989 | Fed. Rep. of Germany . |

OTHER PUBLICATIONS

Reim, H. M., "Intergrierte . . . " 1980, pp. 245-255.
Tietze, U., "Halbleiter . . . " 1976, pp. 172-173.
Camemzind, H. R., "An Outline of . . . " 1969, pp. 110-121.
Schmerbeck, T. J., "Precise Current . . . " 1984, pp. 4826-4827.
Myrow, D. D., "Beta-Compensated . . . " 1983, p. 1374.
IBM Technical Disclosure Bulletin, vol. 26, No. 38.
E. L. Long et al., "High-Gain 15-W Monolithic Power Amplifier with Internal Fault Protection", No. 1, Feb. 1971, pp. 35-44.
Patent Abstracts of Japan, vol. 9, No. 305 (E-3630[2028], Jul. 1985, 144,008.

*Primary Examiner*—Stanley D. Miller
*Assistant Examiner*—Richard Roseen
*Attorney, Agent, or Firm*—Spencer & Frank; Spencer, Frank & Schneider

[57] ABSTRACT

In a circuit array for setting the operating point of a first transistor. A current-inverting circuit (current mirror circuit) has a pinch resistor connected in series with the base-emitter path of another transistor within the current inverting circuit. The current inverting circuit supplies the current-inverting base current of the first transistor.

26 Claims, 6 Drawing Sheets

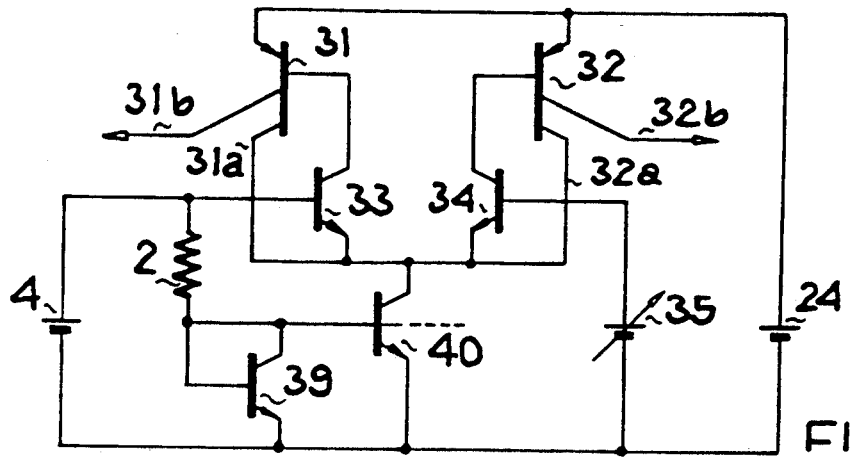
FIG.13a
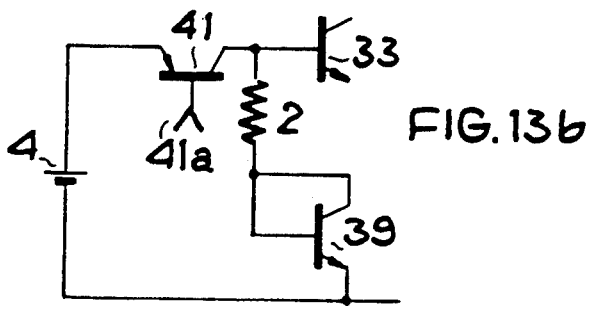
FIG.13b
FIG.14
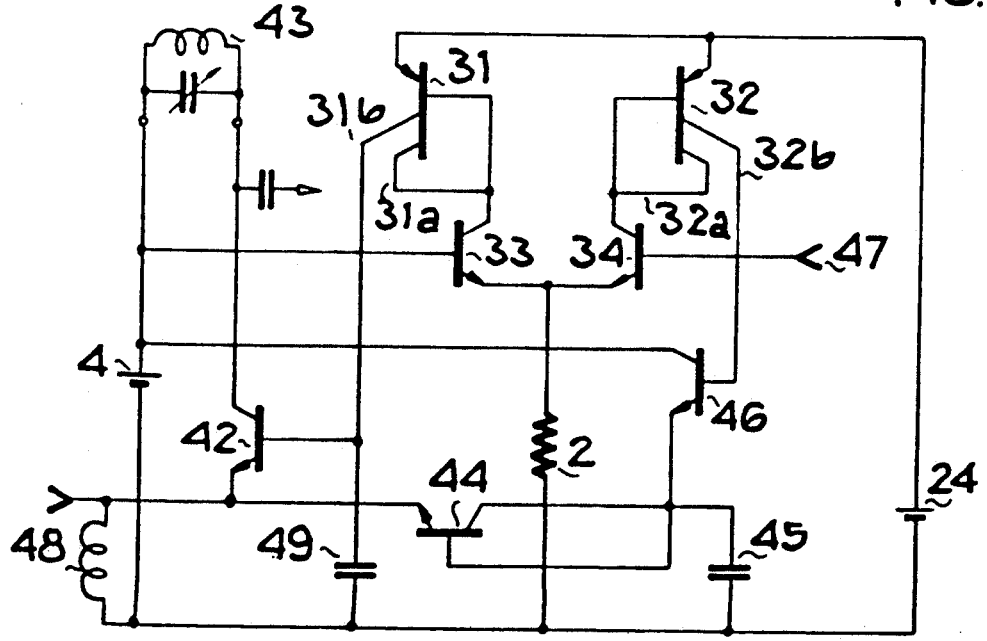

5,124,575

CIRCUIT ARRAY FOR SETTING THE OPERATING POINT OF A TRANSISTOR

BACKGROUND OF THE INVENTION

The invention is concerned with setting the operating point of transistors, in particular bipolar transistors, in an integrated circuit in which the collector currents of the transistors are predetermined by the base-emitter currents. These base-emitter currents can be fixed by resistors, for example, via which the base-emitter paths are fed by a supply voltage. Setting of the operating point in this way has the advantage that relatively low operating voltages are possible with a minimum of operating current. The low operating voltage possible is a result of the fact that the emitter potentials, e.g. of npn transistors, can be directly connected to the negative terminal of the supply voltage. The minimum operating current is possible because only the base-emitter currents are required in addition to the collector currents needed for the circuit to function. The drawbacks of setting the operating point in this way are that with predetermined resistances for operating point setting, the collector currents depend on the current amplification factors of the transistors and on the base-emitter voltages that are obtained.

In general, negative-feedback arrays are used for operating point setting of transistors, such as negative emitter feedback, where an emitter-current-stabilizing resistor is provided and where the base is supplied with a fixed potential.

SUMMARY OF THE INVENTION

The object of the invention is to provide a circuit array for setting the operating point in a transistor that offers the possibility of the transistor electrodes accepting different potentials, thereby achieving a degree of freedom for dimensioning the stage in which the transistor is used. According to the invention, there is provided a circuit array for stabilizing the operation of a transistor, wherein a current-inverting, i.e., current-mirror, circuit is provided that supplies the base current of the transistor.

BRIEF DESCRIPTION OF THE DRAWINGS

The invention will now be described in greater detail, by way of examples, with reference to the drawings, in which FIGS. 11 to 14 show circuits controlling the collector currents of npn transistors.

DESCRIPTION OF THE PREFERRED EMBODIMENTS

Figure 1:
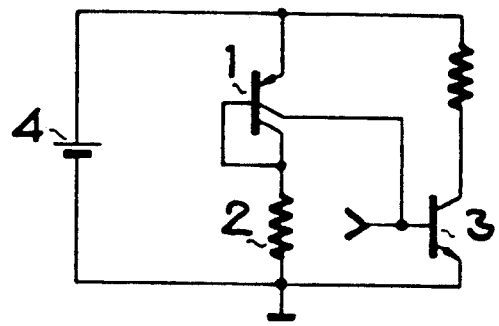
FIG. 1 shows a circuit array, according to the invention, for setting the operating point of a transistor.

FIG. 1 shows a circuit array in accordance with the invention, where a current-inverting or current-mirror circuit comprising transistor 1 supplies, together with resistor 2, the base-emitter currents for setting the collector current of transistor 3.

Figure 2:
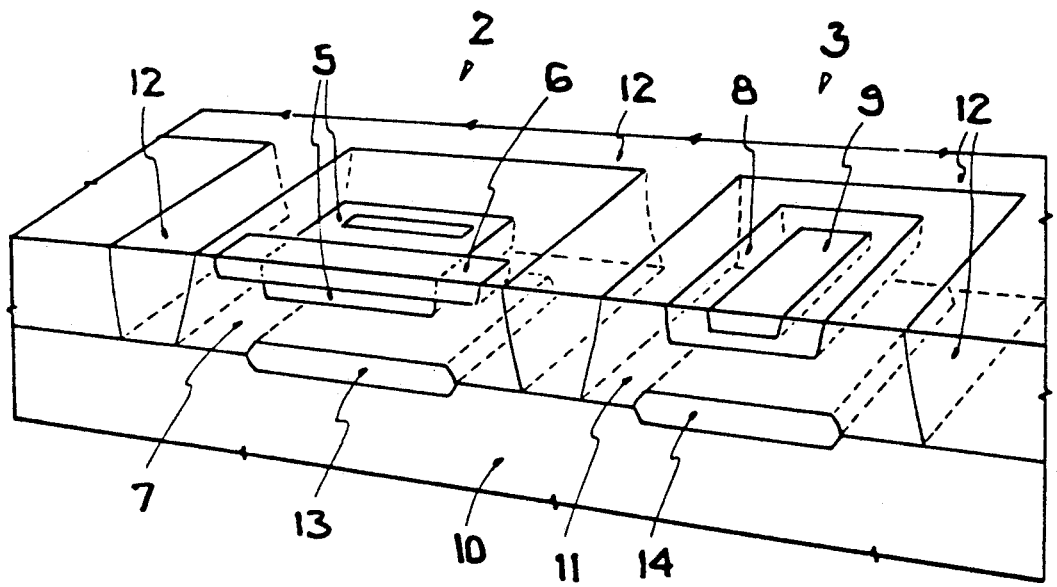
FIG. 2 shows a pinch resistor.

The current-inverting (current-mirror) circuit converts the current flowing in resistor 2 at a certain ratio (inversion ratio) to the collector current of the collector of transistor 1. The respective current inversion ratio is determined here by the design of the inverting transistor 1. In the embodiment in FIG. 1, the inverting transistor 1 is a lateral pnp transistor with several collector segments. The size of the current flowing through resistor 2 is determined by the supply voltage from source 4, the base-emitter voltage of transistor 1, and the value of resistor 2. By contrast, the current amplification factor of transistor 1 has a relatively minor effect on the current inversion ratio. A substantial feature of the circuit in FIG. 1 according to the invention (and also of the other circuits) is the type of resistor 2. This resistor is a so-called pinch resistor which is made together with transistor 3. A pinch resistor comprises, according to FIG. 2, a resistance zone 5 limited in the vertical direction by two semiconductor zones 6 and 7. Semiconductor zones 6 and 7 are of the opposite conductivity type to resistance zone 5. Resistance zone 5 is made in the same process step as the base zone 8 of the transistor 3 situated next to the pinch resistor in FIG. 2, so that resistance zone 5 has the same conductivity type, the same conductivity and the same penetration depth as the base zone 8 of transistor 3. In similar manner, the semiconductor zone 6 located above the resistance zone 5 and bordering the semiconductor surface is made in the same operation as emitter zone 9 of transistor 3, so that semiconductor zone 6 has the same conduction, the same conductivity and the same depth as emitter zone 9 of transistor 3. The semiconductor element of the integrated circuit array in FIG. 2 comprises a substrate 10 of the first conductivity type and an epitaxial layer 11 of the second conductivity type. The electrical separation of the circuit array components in FIG. 2 is achieved with separation zones 12 of the first conductivity type. Resistance zone 5 and base zone 8 are of the first conductivity type. Concealed layers 13 and 14 of the second conductivity type are underneath pinch resistor 2 and transistor 3.

Using a pinch resistor has the advantage that its resistance value correlates with the current amplification factor ($H_{FE}$) of the integrated (npn) transistor 3 in such a way that the resistance value of pinch resistor 2 is substantially proportional to the current amplification factor of the (npn) transistor 3. Under these circumstances, it is possible in the circuit according to the invention to compensate for the effect caused by the current amplification factor ($H_{FE}$) dispersion on the collector current of transistor 3 by the opposite-acting dispersion of pinch resistor 2.

A further substantial feature of the invention is the dimensioning of the supply voltage from source 4. The value of this supply voltage has an effect on the temperature development of the set collector current. There is an optimum value for the supply voltage from source 4 for the collector current of transistor 3 to be largely dependent on temperature. This is based on the fact that the temperature development of pinch resistor 2 is strongly positive and that the temperature development of the base-emitter voltage of transistors, and so of transistor 3, is negative (approx. −2 mV/K), as is well known. It is therefore possible to compensate not only the temperature development of the collector current, but also to set both a positive and a negative temperature development for the collector current of transistor 3.

As can be seen from FIG. 1, it is not necessary to set the emitter potential of transistor 3 to reference potential, since the base-emitter current supply to transistor 3 in accordance with the invention is largely independent of the emitter potential of transistor 3, provided the circuit-inverting transistor 1 is not set to saturation.

Figure 3:
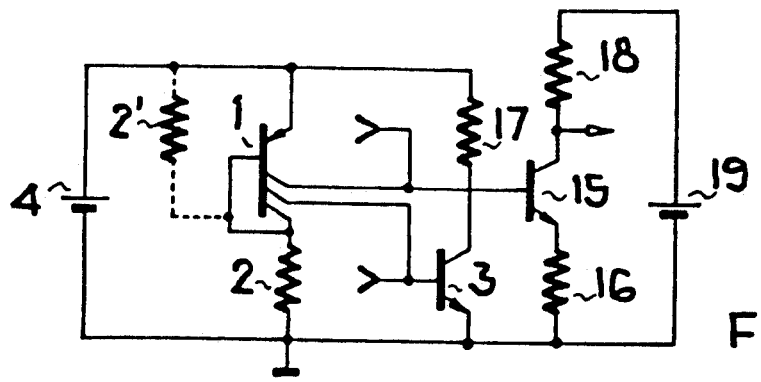
FIG. 3 shows a circuit array with a current-inverting or current-mirror circuit that sets the operating point of two transistors.

The circuit array in FIG. 3 differs from that in FIG. 1 in that the current-inverting circuit not only sets the operating point of a transistor 3, but also the operating points of two transistors (3, 15) by the base-emitter currents of transistors 3 and 15 for setting the collector currents of transistors 3 and 15 being generated by current-inverting circuit 1 and pinch resistor 2. The current-inverting circuit (1) converts the current flowing in pinch resistor 2 at a certain ratio (inversion ratio) to the collector currents of transistors 3 and 15. The respective current-inverting ratio is determined by the design of the current-inverting transistor 1. The current-inverting transistor 1 is, as in the embodiment in FIG, 1, a lateral pnp transistor with several collector segments. By using a pinch resistor 2 it is possible with the circuit array in FIG. 3 to insert a resistor 16, for example, into the emitter line of transistor 15, without substantially affecting the collector current in transistor 15. The invention therefore gives a relatively high degree of freedom when dimensioning the circuit components. In the circuit array according to FIG. 3, resistor 17 is in the collector line of transistor 3 and resistor 18 in the collector line of transistor 15. The circuit array in FIG. 3 has a second voltage source 19 whose voltage is greater than that from source 4. One terminal of voltage source 19 is connected to the emitter of transistor 15 via resistor 16 and to the emitter of current-inverting transistor 1 via pinch resistor 2. The second terminal of voltage source 19 is connected to the collector of transistor 15 via resistor 18.

The FIG. 3 circuit shows in a dashed line a modification in the form of a further pinch resistor 2′. The use of this resistor 2′ permits the use of a higher value for the supply voltage from source 4, with the same settable temperature development for the collector currents of transistors 3 and 15. Resistor 2′ forms with resistor 2 a voltage divider that diverts the voltage value necessary for temperature development compensation by voltage division from the supply voltage (4). In order to make the size of the collector currents set according to the invention independent of changes in the operating voltage, appropriate stabilization of the supply voltage (4) normally diverted from the operating voltage is necessary.

Figure 4:
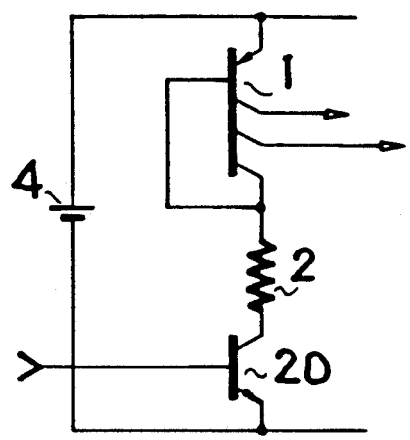
FIG. 4 shows a section of the circuit in FIG. 3.

FIG. 4 shows a section (current-inverting or current-mirror transistor, pinch resistor) of the circuit according to FIG. 3. In contrast to the circuit in FIG. 3, the circuit section shown in FIG. 4 has a further transistor 20 whose collector-emitter path is connected in series to resistor 2. This transistor 20 serves as a switch for turning the current-inverting circuit on and off. Switch-on is achieved by imprinting a current into the base of transistor 20. The necessary size of this current can for example be up to 10 times smaller than the current to be generated in resistor 2. This makes it possible to switch all collector currents set with the circuit on and off using a relatively low switching current (standby function).

Figure 5:
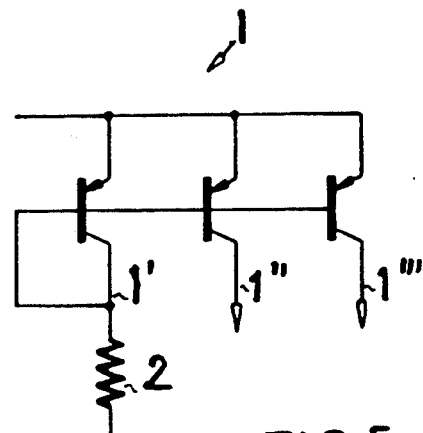
FIG. 5 shows also a section of the circuit in FIG. 3.

FIG. 5 shows a further section through the circuit according to FIG. 3, where instead of a lateral pnp transistor with several collector segments several pnp transistors (1′, 1″, 1‴) can be used.

Figure 6:
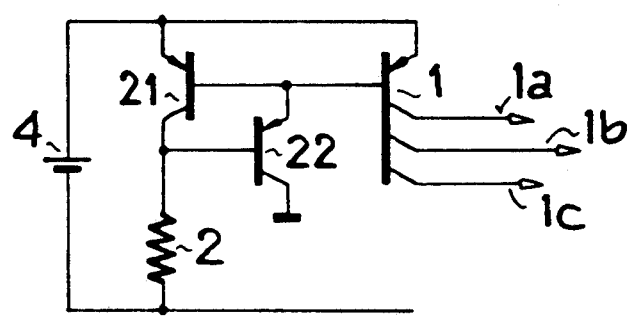
FIG. 6 shows a circuit array for setting the operating point having a current-inverting circuit comprising three transistors.

FIG. 6 shows a circuit according to the invention in which the current-inverting circuit is built up of transistors 1, 21 and 22. This array has the advantage over previously shown current-inverting arrays that the current inversion ratio is more independent of the current amplification factors of the pnp transistors used. The base-emitter currents for setting the operating point in accordance with the invention of the (not shown) transistors are taken from the collectors of the circuit-inverting transistor 1. In the circuit according to FIG. 6 the voltage source 4 requires in comparison with previous circuits about double the supply voltage for the same temperature dependence of the set collector currents. Instead of the described current-inverting transistors, other known current inversion arrays can also be used.

Figure 7A:
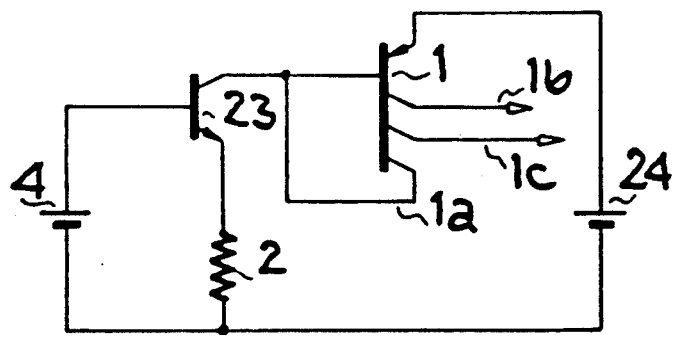
FIG. 7a shows a circuit in which the current to be inverted for the current-inverting circuit originates from the collector of a transistor.

FIG. 7a shows a current in accordance with the invention in which the current to be inverted for the current-inverting circuit 1 originates from the collector of transistor 23. The collector current of this transistor 23 is practically identical to its emitter current, which results from the supply voltage from source 4 in conjunction with the series connection comprising the base-emitter path of transistor 23 and resistor 2. Since the current-inverting array with transistor 1 and its emitter connection can be based on supply voltage source 24, greater potential differences can be achieved for the bases controlled by the current-inverting circuit 1 via collectors 1b and 1c.

Figure 7B:
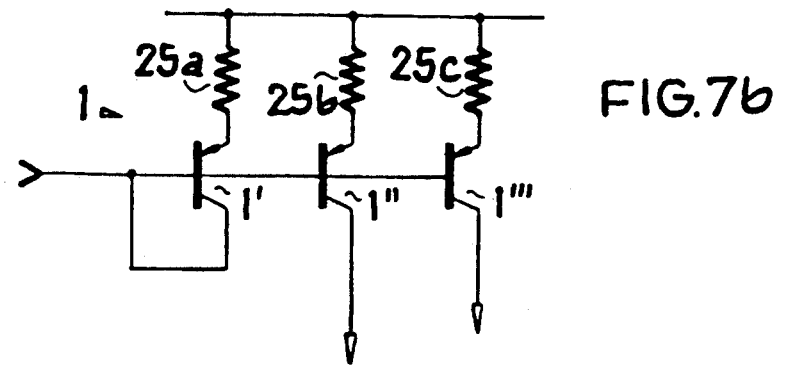
FIG. 7b shows part of the circuit in FIG. 7a, FIG. 8 shows a circuit similar to FIG. 7a, FIG. 9 shows a further embodiment of the circuit in accordance with the invention.

FIG. 7b shows a circuit detail of the circuit according to FIG. 7a. Separate pnp transistors 1′, 1″ and 1‴ are used for the current inversion, with the resistors 25a, 25b and 25c being inserted in addition into the emitter lines of these transistors.

When the size of the voltage obtained at these resistors is great enough, negative feedback is obtained which reduces the detrimental influences of the early effect of current-inverting circuits (dependence of the output currents of the current-inverting transistors on changes in the supply voltage) corresponding to the degree of negative feedback. To achieve an effective negative feedback, correspondingly high values for resistors 25a, 25b and 25c are required on account of the generally low currents in these transistors. In this connection, it is an advantage to use pinch resistors here too, as for resistor 2. As is well known, this type permits higher resistances to be achieved easily with a low chip surface requirement. Use of this resistor type for resistor 2 and for negative feedback resistors 25a, 25b and 25c has at the same time the effect of making the degree of negative feedback independent of the dispersion of these pinch resistors.

Figure 8:
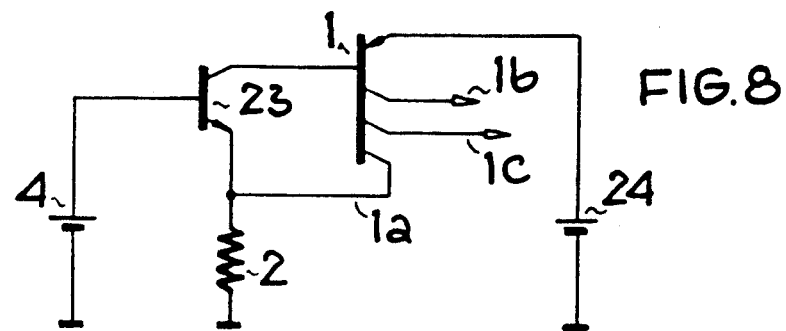

The circuit array in FIG. 8 differs from the circuit according to FIG. 7a in that the collector connection 1a of current-inverting transistor 1 is not connected to the base of the same transistor (1), but to the emitter of transistor 23. The advantage of this circuit is that the influence of the early effect on the output currents (1b, 1c), based on the change in the supply voltage from source 24, is reduced. This is achieved by the control loop formed by the feedback of part of the collector current from transistor 1 to the emitter of transistor 23. This control loop has the effect that changes in the collector current in collector 1a caused by the early effect are largely eliminated by adjustment. The changes in the output currents in collectors 1b and 1c are also thereby reduced (regulated).

Figure 9:
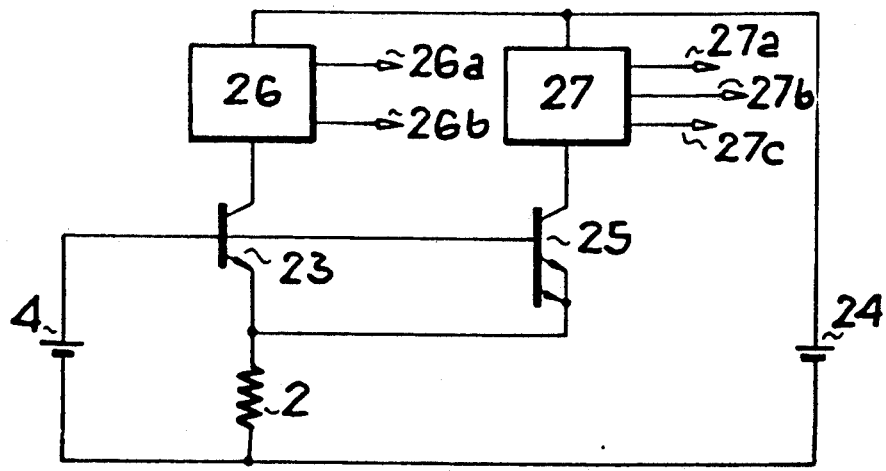

FIG. 9 shows an embodiment of the invention. In the array according to FIG. 9 the base-emitter path of transistor 23 is connected in parallel with the base-emitter path of a further transmitter 25 whose emitter surface is, as indicated in FIG. 9, for example twice the size of the emitter surface of transistor 23. The collectors of transistors 23 and 25 are connected to the symbolically indicated current-inverting arrays 26 and 27 respectively. These current-inverting arrays supply at their outputs (26a, 26b, and 27a, 27b and 27c) the base-emitter currents for setting the collector currents of npn transistors (not shown). The object of this circuit is to distribute the currents passing to the current-inverting circuits 26 and 27 in accordance with the surface ratio of the emitter surfaces of transistors 23 and 25. In the example in question, ⅓ of the current generated in pinch resistor 2 passes to current-inverting circuit 26, and ⅔ to current-inverting circuit 27.

Figure 10:
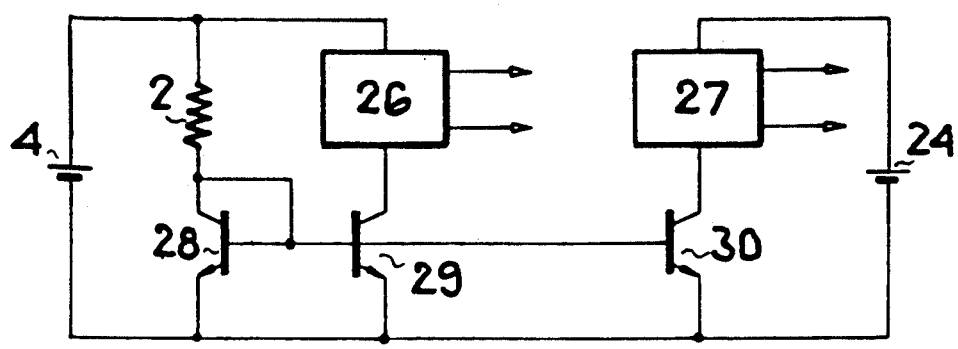
FIG. 10 shows a circuit in which current-inverting circuits are controlled by a current-inverting circuit.

FIG. 10 shows a circuit in accordance with the invention whereby current-inverting (current-mirror) circuits 26 and 27 are controlled by a current-inverting circuit comprising transistors 28, 29 and 30. The current controlling this current-inverting circuit is determined by pinch resistance 2 in conjunction with the supply voltage of source 4.

The circuits according to the invention and described in FIGS. 11, 12, 13 and 14 are based on the control of collector currents of npn transistors. The control of collector currents is used for controlling the amplification of transistor stages, for example. For this purpose, the base-emitter currents of the transistors to be controlled are, in accordance with the invention, changed by a control signal. It is necessary or advisable here, for special applications, that reverse-direction control of collector currents is provided. Furthermore, it may be necessary in the case of reverse-direction control of collector currents to design it so that the sum of these controlled currents remains constant.

Figure 11:
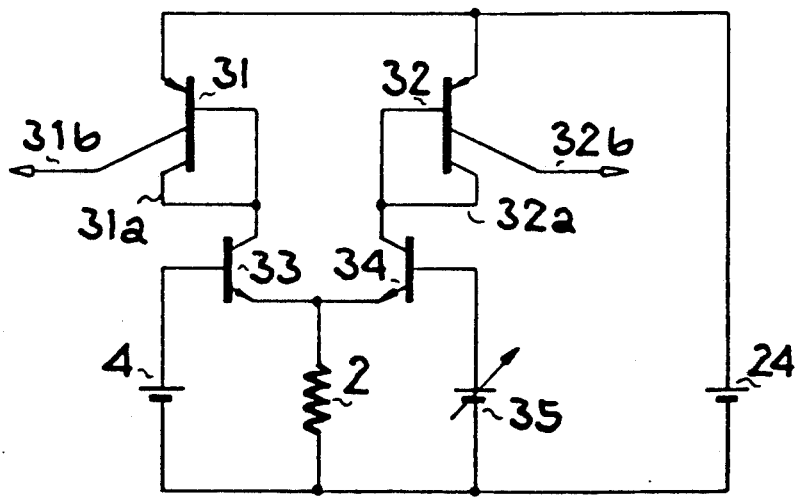

FIG. 11 shows a circuit array in accordance with the invention for reverse-direction control of two npn transistors (not shown). In this circuit two current-inverting arrays 31 and 32 are controlled by the collectors of transistors 33 and 34. The output currents with which the npn transistors are controlled are taken from collector 31b and 32b. The output currents are controlled by the control of the emitter current distribution of transistors 33 and 34 by the change in the base potential of transistor 34, e.g. by means of the variable voltage of source 35.

Figure 12A:
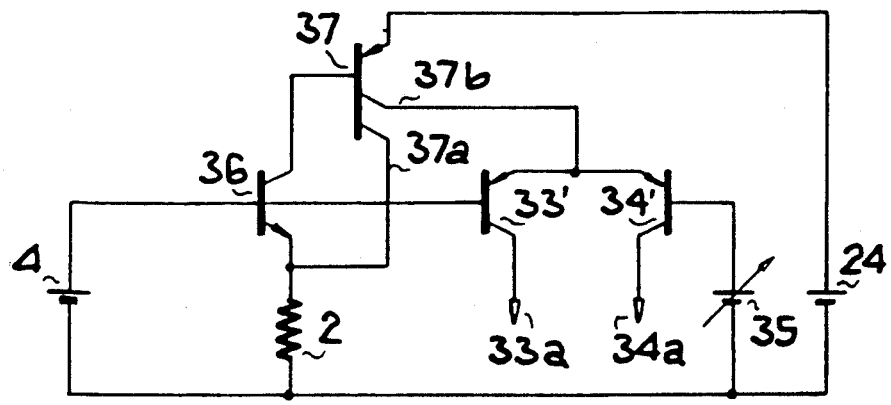

An embodiment of the circuit according to FIG. 11 is shown in FIG. 12a. In this circuit transistor 36 forms together with current-inverting array 37 a DC control circuit via the connection of collector 37a to the emitter of transistor 36. This control loop has the effect of keeping the sum of the base current for current-inverting transistor 37 and of the collector current of collector 37a constant. The sum of these currents is equal to the current flowing through pinch resistor 2. Here, the base current of transistor 36 is negligible. The collector current of collector 37b has a certain ratio to the collector current of collector 37a and passes to the common emitter connection of transistors 33' and 34'. By controlling the base potential of transistor 34' this current is divided between the two collectors 33a and 34a. With the described DC circuit the influence of the early affect of current-inverting transistor 37 on the output currents (33a and 34a), based on the voltage change of supply voltage source 4, is reduced. Compared with the circuit according to FIG. 11, this circuit achieves a higher constancy in the sum of the controlled collector currents.

Figure 12B:
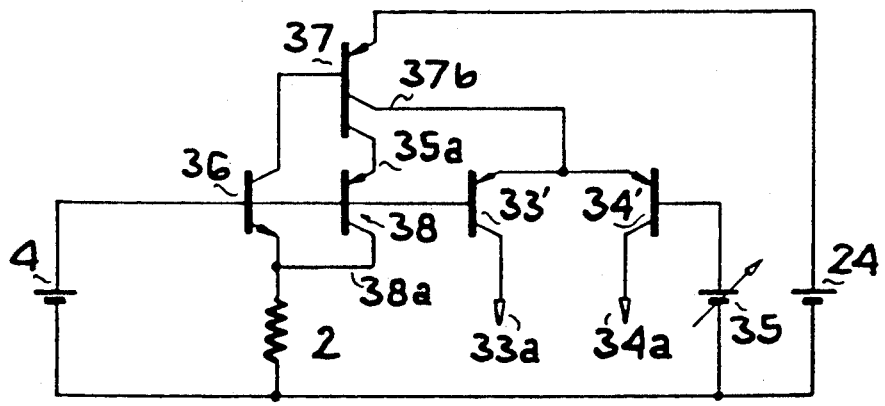

FIG. 12b shows an embodiment of the circuit according to FIG. 12a. Compared with the circuit according to FIG. 12a, an additional transistor 38 is provided to whose emitter the current of collector 37a is passed. The collector current (38a) of transistor 38 is passed to the emitter of transistor 36. The advantage of this circuit type over the circuit according to FIG. 12a is that the potentials of collectors 37a and 37b are identical, thereby further reducing the influence of the early effect. In addition, the influence of the current amplification factor of transistors 33' and 34' on the output currents of collectors 33a and 34a is compensated by the reverse-direction influence of the current amplification factor of transistor 38 in the circuit according to FIG. 12b.

FIG. 13a shows a circuit in accordance with the invention in which the current control (current distribution) is effected via transistors 33 and 34, as for FIG. 11. However, the difference to FIG. 11 is that the current to the emitters of transistors 33 and 34 does not pass via a resistor, but via a current-inverting circuit with transistors 39 and 40. The current generated in this current-inverting circuit is determined with pinch resistor 2. To reduce the influence of the early effect of current-inverting transistors 31 and 32, collectors 31a and 32a are connected to the emitters of transistors 33 and 34. Unlike in the circuit according to FIG. 11, this achieves both a reduction in the influence of the early effect and a higher constancy in the sum of controlled collector currents (31b and 32b).

FIG. 13b shows an addition to the circuit in FIG. 13a, whereby the collector-emitter path of a transistor 41 is inserted into the supply line from the supply voltage source 1 to the connection point of resistor 2 and the base of transistor 33. This transistor 41 acts as a switching transistor with which the circuit can be switched on and off with base control 41a. Both a pnp transistor, as shown in FIG. 13b, and an npn transistor can be used as the switching transistor 41. To switch on the circuit the transistor 41 must be controlled by a correspondingly aligned base current in the flow direction.

FIG. 14 shows a circuit in accordance with the invention for use in a controlled-amplification receiver prestage. In the circuit according to FIG. 14, transistor 42 is used as the amplifier transistor in the main base circuit, where the signal passes to the emitter of transistor 42 and the amplified signal is picked up by collector circuit 43. The amplified signal passes to a following mixer stage, for example. To control the signal amplification, the base-emitter DC current of transistor 42 is, in this circuit array, controlled via the collector 31b of the current-inverting transistor 31. The transistor 44, connected as a diode, has the job of diverting the input signal current to the reference potential via capacitor 45 during downward control of the amplification. For this purpose transistor 44 is set conductive via the emitter direct current of transistor 46. The base current for transistor 46 is supplied by collector 32b of the current-inverting transistor 32.

Control of current distribution for transistors 42 and 46 is achieved via the base potential of transistor 34. Control signal 47 is supplied by a control signal source (not shown), for example. Control follows the principle of the circuit shown in FIG. 11. Accordingly, the collector currents of transistors 42 and 46 are controlled with reverse direction, with the sum of controlled collector currents remaining almost constant. This ensures, for example, that the load from current supply source 4 undergoes practically no change during control of amplification. At the input of the circuit is a coil 48 which achieves a DC connection to the reference potential. The capacitor 49 has the same function as capacitor 45. Capacitor 50 separates the potential of the collector of transistor 42 from the following part of the circuit (mixer stage).

What is claimed is:

1. In an integrated circuit including a first transistor and circuit means for setting the operating point of said first transistor, with said circuit means including current-inverting means having at least one current inverting transistor connected to receive an input current and to provide the base current of said first transistor, the improvement comprising:
a pinch resistor connected in series with the base-emitter path of said at least one current inverting transistor and determining said input current;
wherein the series connection of said pinch resistor and said base-emitter path of said at least one current-inverting transistor is connected across a first voltage source: and
wherein the voltage of said voltage source determines the temperature development of said first transistor.

2. A circuit according to claim 1,
wherein said at least one current-inverting transistor is a multi-collector transistor having one collector connected to provide an output current for said base of said first transistor and a further collector connected to one end of said pinch resistor.

3. A circuit according to claim 1,
wherein said current-inverting circuit means includes at least two current-inverting transistors, the collector of one of said at least two current-inverting transistors being connected to one end of said pinch resistor, and the collector of the other of said at least two current-inverting transistors being connected to provide an output current for the base of said first transistor.

4. In an integrated circuit including a first transistor and circuit means for setting the operating point of said first transistor, with said circuit means including current-inverting (current mirror) means having at least one current inverting transistor connected to receive an input current and to provide the base current of said first transistor, the improvement comprising:
a pinch resistor connected in series with the base-emitter path of said at least one current inverting transistor and determining said input current;
wherein the series connection of said pinch resistor and said base-emitter path of said at least one current-inverting transistor is connected across a first voltage source;

wherein a second transitor is provided for controlling said current-inverting circuit means, said second transistor having its collector-emitter path connected between said pinch resistor and the base of said current inverting transistor;
wherein a first terminal of a second voltage source is connected to the base of said second transistor; and
wherein a second terminal of said second voltage source is connected to one terminal of the first voltage source.

5. A circuit according to claim 4,
wherein said second voltage source supplies a lower voltage than said first voltage source.
controlling said multi-collector current-inverting transistor.

6. A circuit according to Claim 4,
wherein said circuit includes a plurality of said first transistors whose operating points are to be controlled;
wherein said current-inverting circuit means includes a plurality of said current inverting transistors each having its base-emitter path connected in series with said pinch resistor;
wherein each of said plurality of first transistors has its base connected to receive an output of a respective one of said plurality of current inverting transistors; and
wherein means are provided to reduce the effect of voltage changes in said first voltage source on the outputs of said current inverting transistors of said current-inverting circuit means.

7. A circuit according to Claim 6,
wherein said means to reduce the effect of voltage changes in said first voltage source on the outputs of said current inverting transistors of said current-inverting circuit means comprise respective emitter resistors provided in respective emitter supply lines of said current inverting transistors.

8. A circuit according to claim 7,
wherein said emitter resistors are pinch resistors.

9. A circuit according to claim 4,
wherein said current-inverting transistor is a multi-collector transistor which provides an output current at one collector;
wherein a further transistor is provided whose emitter is connected to a further collector of said multi-collector current-inverting transistor;
wherein the collector of said further transistor is connected to one end of said pinch resistor;
and wherein the base of said further transistor is connected to the base of said second transistor controlling said multi-collector current-inverting transistor.

10. A circuit according to claim 4,
wherein said current-inverting circuit means includes at least two of said current-inverting transistors having their respective bases connected together;
wherein in further transistor is provided whose emitter is connected to the collector of one of said current-inverting transistors;
wherein the collector of the other of said current-inverting transistors provides an output current from said current-inverting circuit means;
wherein the collector of said further transistor is connected to one end of said pinch resistor; and
wherein the base of said further transistor is connected to the base of said second transistor controlling said one of said current-inverting transistor whose collector is connected to said emitter of said further transistor.

11. A circuit according to claim 6, wherein a further of said current-inverting transistors has its collector connected to a common connection of its base and the collector of said second transistor.

12. In an integrated circuit including a first transistor and circuit means for setting the operating point of said first transistor, with said circuit means including current-inverting (current mirror) means having at least one current inverting transistor connected to receive an input current and to provide the base current of said first transistor, the improvement comprising:

a pinch resistor connected in series with the base-emitter path of said at least one current inverting transistor and determining said input current;

wherein the series connection of said pinch resistor and said base-emitter path of said at least one current-inverting transistor is connected across a first voltage source;

wherein a second transistor is provided for controlling said current-inverting circuit means, said second transistor having its collector-emitter path connected between said pinch resistor and the base of said current inverting transistor;

wherein a second voltage source terminal is connected to the base of said second transistor;

wherein several of said current-inverting circuit means and several of said second transistors, each connected to said pinch resistor, are provided; and wherein each of said current-inverting circuit means is controlled independently by a respective one of said second transistors.

13. A circuit according to Claim 12, wherein the emitters of said second transistor controlling the respective current-inverting circuit means are connected to one another.

14. A circuit according to claim 13, wherein the bases of said second transistors controlling the respective current-inverting circuit means are connected to one another.

15. A circuit according to claim 14, wherein the respective said second transistors controlling the respective current-inverting circuit means have different emitter surfaces.

16. A circuit according to claim 15, wherein the currents for the respective said current-inverting circuit means are determined by said emitter surfaces of the respective second transistors.

17. A circuit according to claim 12, wherein the respective second transistors control the current passing to the respective current-inverting transistors of the respective current-inverting circuit means.

18. A circuit according to claim 17, wherein the emitters of said second transistors controlling the respective current-inverting transistors are connected to one another, and to said pinch resistors; and wherein the control currents for the respective current-inverting transistors are controlled by the base potentials of the respectively associated second transistors.

19. A circuit according to claim 12, wherein the bases of said second transistors controlling the respective current-inverting circuit means are connected to one another.

20. In an integrated circuit including a first transistor and circuit means for setting the operating point of said first transistor, with said circuit means including current-inverting (current mirror) means having at least one current-inverting transistor connected to receive an input current and whose output provides the base current of said first transistor, the improvement comprising:

least two of said current-inverting transistors having their respective bases connected together;

wherein a further transistor is provided whose emitter is connected to the collector of one of said current-inverting transistors;

wherein the collector of the other of said current inverting transistors provides an output current from said current inverting circuit means;

wherein the collector of said further transistor is connected to one end of said pinch resistor; and wherein the base of said further transistor is connected to the base of said second transistor controlling said one of said current-inverting transistor whose collector is connected to said emitter of said further transistor.

21. A circuit according to claim 20, further comprising means for controlling base-emitter currents of ones of said first transistors whose operating points are set differently.

22. A circuit according to claim 20, further comprising a differential amplifier connected to divide said current-inverting transistor output into two currents for ones of said first transistors whose operating points are set differently.

23. In an integrated circuit including a first transistor and circuit means for setting the operating point of said first transistor, with said circuit means including current-inverting (current mirror) means having at least one current inverting transistor connected to receive an input current and whose output provides the base current of said first transistor, the improvement comprising:

a pinch resistor connected in series with the base-emitter path of said at least one current inverting transistor and determining said input current;

wherein a circuit means, including a further transistor, is provided for interrupting said series connection of said pinch resistor and said at least one current inverting transistor.

24. In an integrated circuit including a first transistor and circuit means for setting the operating point of said first transistor, with said circuit means including current-inverting (current mirror) means having at least one current inverting transistor connected to receive an input current and whose output provides the base current of said first transistor, the improvement comprising:

a pinch resistor connected in series with the base-emitter path of said at least one current inverting transistor and determining said input current;

wherein said first transistor whose operating point is set is included in an amplifier circuit;

wherein two of said first transistors are used in said amplifier circuit;

wherein said circuit-inverting circuit means includes two of said current inverting transistors for providing respective base currents for respective first transistors; and wherein means are provided for controlling the currents of the respective first transistors with reverse directions.

25. A circuit according to claim 24, wherein said means for controlling the currents of said first transistors with reverse-directions includes means for causing the sum of the base currents of said first transistors to be kept constant.

26. A circuit according to claim 24, wherein said means for controlling the currents of said first transistors with reverse-directions includes a further transistor having a collector-emitter path connected in series with said series connection of said pinch resistor and said base-emitter path of said at least one current inverting transistor, and having a base connected to a control terminal.

* * * * *